United States Patent [19]

Kuwahara et al.

[11] Patent Number: 5,925,929
[45] Date of Patent: *Jul. 20, 1999

[54] COOLING APPARATUS FOR ELECTRONIC ELEMENTS

[75] Inventors: Heikichi Kuwahara, Tsuchiura; Kazumasa Fujioka, Ibaraki-ken; Toshio Takasaki, Katsuta; Syuuji Saitoo, Katsuta; Eiichi Toyota, Katsuta, all of Japan

[73] Assignee: Hitachi, Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/738,710

[22] Filed: Oct. 28, 1996

Related U.S. Application Data

[63] Continuation of application No. 08/406,091, Mar. 16, 1995, abandoned, which is a continuation of application No. 08/077,073, Jun. 16, 1993, abandoned.

[30] Foreign Application Priority Data

Jul. 3, 1992 [JP] Japan .................................... 4-176497

[51] Int. Cl.⁶ .................................................. H01L 23/34
[52] U.S. Cl. ........................... 257/714; 257/717; 257/722; 361/699; 165/80.4
[58] Field of Search ............................... 257/713–5, 718, 257/6, 7, 722; 361/713, 699; 165/80.4, 104.33, 104.14, 189, 905

[56] References Cited

U.S. PATENT DOCUMENTS

| | | | |
|---|---|---|---|
| 3,739,234 | 6/1973 | Bylund et al. | 257/722 |
| 3,818,983 | 6/1974 | Grandia | 257/722 |
| 3,852,803 | 12/1974 | Walmet et al. | 257/714 |
| 3,852,806 | 12/1974 | Corman et al. | 257/722 |
| 4,072,188 | 2/1978 | Wilson et al. | 257/714 |
| 4,145,708 | 3/1979 | Ferro et al. | 257/722 |
| 4,567,505 | 1/1986 | Pease et al. | 257/714 |
| 4,794,981 | 1/1989 | Mizuno | 165/80.4 |
| 4,949,219 | 8/1990 | Moriizumi et al. | 361/699 |
| 5,046,552 | 9/1991 | Tousignant | 257/714 |
| 5,095,404 | 3/1992 | Chao | 361/700 |
| 5,331,510 | 7/1994 | Ouchi et al. | 174/15.2 |

FOREIGN PATENT DOCUMENTS

| | | |
|---|---|---|
| 1-192146 | 8/1989 | European Pat. Off. . |
| 0 363 687 | 9/1989 | European Pat. Off. . |
| 363687 | 9/1989 | European Pat. Off. . |
| 2-288395 | 10/1974 | France . |
| 2288395 | 10/1974 | France . |
| 2-825582 | 6/1978 | Germany . |
| 2825582 | 6/1978 | Germany . |
| 4-012180 | 4/1990 | Germany . |
| 4012180 | 4/1990 | Germany . |
| 57-164566 | 10/1982 | Japan ..................................... 257/718 |

(List continued on next page.)

OTHER PUBLICATIONS

Hybride leistungs–IC, Werner Bresch, Technische Rundschau 78 (1986) Nov., No. 45, pp. 106–109, Aug. 1995.

*Primary Examiner*—Teresa M. Arroyo
*Attorney, Agent, or Firm*—Evenson, McKeown, Edwards & Lenahan, P.L.L.C.

[57] ABSTRACT

A cooling apparatus for electronic device comprises an electronic element unit which comprises a base member, a thermal conductive electric insulating layer soldered to the base member and a plurality of electronic elements soldered to the thermal conductive electric insulating layer at least one cooling unit which is detachably kept in pressure contact with the base member of the electronic element unit and comprises a cooling block, at least one heat pipe having a refrigerant sealingly contained therein and inserted in the cooling block at one end thereof and a plurality of radiation fins provided at the other end of the at least one heat pipe; and a device which serves to detachably keep the electronic element unit and the cooling unit in pressure contact with each other. The other end of the heat pipe extends obliquely with a predetermined angle ($\alpha$) with respect to the inserted portion thereof.

11 Claims, 6 Drawing Sheets

FOREIGN PATENT DOCUMENTS

| | | | |
|---|---|---|---|
| 62-004349 | 1/1987 | Japan | 257/714 |
| 62-10594 | 1/1987 | Japan . | |
| 62-4349 | 1/1987 | Japan | 257/714 |
| 63-254754 | 10/1988 | Japan . | |
| 01205452 | 8/1989 | Japan | 257/714 |
| 1-192148 | 8/1989 | Japan . | |
| 1-205452 | 8/1989 | Japan | 257/714 |
| 02068495 | 3/1990 | Japan | 465/905 |
| 2-68495 | 3/1990 | Japan | 165/905 |
| 02291157 | 11/1990 | Japan | 257/714 |
| 2-291157 | 11/1990 | Japan | 257/714 |
| 04007860 | 1/1992 | Japan | 257/722 |
| 4-7860 | 1/1992 | Japan | 257/722 |
| 4-225790 | 10/1992 | Japan . | |

COOLING APPARATUS FOR ELECTRONIC ELEMENTS

This is a continuation of application Ser. No. 08/406,091, filed Mar. 16, 1995, which is a continuation of application Ser. No. 08/077,073, filed on Jun. 16, 1993, both now abandoned.

BACKGROUND OF THE INVENTION

The present invention relates to a cooling apparatus for electronic elements, and more particularly, to a cooling apparatus which is suitable to cool semiconductor elements such as transistors and thyristers.

Examples of the apparatus for cooling the electronic elements such as transistor and thyrister by radiating heat generated therefrom are disclosed in Japanese Patent Unexamined Publication Nos. 63-254754 and 1-192148. The cooling apparatus disclosed in the latter publication comprises an electronic device, a metallic block which serves as a heatsink of the electronic device, a plurality of heat pipes each extending in the vertical direction with one end thereof inserted in the metallic block and having a plurality of horizontal cooling fins provided at the other end thereof, a thermal conductive electric insulator disposed between the electronic device and the metallic block, conductor metals formed integrally with the thermal conductive electric insulator or both surfaces thereof, a duct which envelops the cooling fins, and a fan to supply cold wind to the duct. The thermal conductive electric insulator having the conductor metals formed integrally therewith, the electronic device and the metallic block are kept in pressure contact with each other or bonded together by means of bonding agent.

Heat of the electronic device is transferred to the metallic block through the conductor metal, the thermal conductive electric insulator and the other conductor metal. Heat transferred to the metallic block is transferred to a refrigerant sealingly contained in the heat pipes and it evaporates the refrigerant. The evaporated refrigerant moves upwards within the heat pipes to the other ends thereof where the radiation fins are provided. At the other ends, heat is removed by the cold wind supplied by the fan, so that the refrigerant is liquefied and returned to the one ends of the heat pipes. In this way, heat of the electronic device is dissipated into the air.

In the cooling apparatus described above, since the thermal conductive electric insulator having the conductor metals formed integrally on the both surfaces thereof, the electronic device and the metallic block are bonded together by means of the bonding agent, when it becomes necessary to change the design of the electronic device, the whole device cooling apparatus must be remodeled, resulting in that the apparatus is very uneconomical and has little flexibility to change of the design.

In case that the thermal conductive electric insulator having the conductor metals formed integrally on the both surfaces thereof, the electronic device and the metallic block are kept in pressure contact with each other, it is possible to change only the electronic device, and however, there arises a problem that the positioning between the electronic device the design of which is changed and the metallic block is not easy actually. Further, in the case of being kept in pressure contact, contact thermal resistance is generated between the pressure contact surfaces of the electronic device and the conductor metal and between the pressure contact surfaces of the conductor metal and the metallic block, resulting in a problem that the thermal conductivity is deteriorated.

In addition, since the radiation fins extend in the horizontal direction, the air warmed by the radiation fins is hindered from moving upwards by the radiation fins themselves. For this reason, heat radiation by natural convection is not sufficient and, hence, the fan for the forced cooling is required.

Moreover, since the heat pipes extend in the vertical direction, there is a problem that the heightwise length of the cooling apparatus is increased. Further, in case that the calorific value of the electronic device is large, it is necessary to increase the radiation capacities of the metallic block and the heat pipes. In this case, however, the widthwise length of the metallic block and the number of the heat pipes must be increased, resulting in a problem that the widthwise length of the cooling apparatus is increased.

SUMMARY OF THE INVENTION

An object of the present invention is to provide a cooling apparatus for electronic deive which is capable of easily coping with change of the design of the electronic device at a low cost without deteriorating the thermal conductivity, achieving a good heat radiation by natural convection and achieving a high degree of freedom in changing the radiation capacity.

A cooling apparatus for electronic device according to the present invention comprises an electronic element unit which comprises a base member, a thermal conductive electric insulating layer soldered to the base member and a plurality of electronic elements soldered to the thermal conductive electric insulating layer, at least one cooling unit which is detachably kept in pressure contact with the base member of the electronic element unit and comprises a cooling block, at least one heat pipe having a refrigerant sealingly contained therein and inserted in the cooling block at one end thereof in the vertical direction and a plurality of radiation fins provided at the other end of the at least one heat pipe substantially perpendicular to an axis of the heat pipe, and means for detachably keeping the electronic element unit and the cooling unit in pressure contact with each other.

According to an embodiment, the other end of the heat pipe extends obliquely with a predetermined angle with respect to the inserted portion thereof. In this case, it is preferred that the predetermined angle is not greater than 90° and, particularly, not greater than 83°.

In order to attain a good thermal conductivity, the cooling block is made of ceramic or metal. Further, the refrigerant sealingly contained in the heat pipe is water.

According to another embodiment, a plurality of cooling units are arranged in the vertical direction.

It is preferred that thermal conductive grease is sandwiched between the base member of the electronic device unit and the cooling unit. In such case, it is preferred that at least one of the pressure contact surfaces of the base member and the cooling unit is formed therein with a plurality of microgrooves.

The cooling unit may comprise a fan duct which extends in parallel with the radiation fins so as to envelop the same therein and a fan which is disposed in the fan duct so as to produce air currents directed toward the radiation fins.

Since the cooling apparatus comprises the electronic element unit, the cooling unit and the means for detachably keeping these units in pressure contact with each other, when it becomes necessary to change the design of some electronic elements in the electronic element unit, it is possible to detach the electronic element unit, change the electronic element and bring the electronic element unit and the cooling unit into pressure contact with each other again by the pressure contact means. Further, the positioning between the electronic element unit and the cooling unit can be performed automatically by the pressure contact means. Namely, the cooling apparatus according to the present invention has a good flexibility to change of the design of the electronic elements and is capable of changing the design at a low cost.

Moreover, in the electronic element unit, the electronic elements are soldered to the thermal conductive electric insulating layer and the thermal conductive electric insulating layer is soldered to the base member, so that there is no possibility of generation of the contact thermal resistance between them. The portion where the contact thermal resistance is generated is only the pressure contact surface between the base member of the electronic element unit and the cooling block of the cooling unit. Therefore, heat of the electronic element unit can be transferred to the cooling unit satisfactorily, so that cooling of the electronic element unit can be performed sufficiently. Further, since the electronic elements and the base member are electrically isolated from each other in the electronic element unit, there is no possibility that the electric current flows through the cooling unit. Accordingly, the refrigerant to be sealingly contained in the heat pipe does not need to have an electric insulation. Therefore, it becomes possible to use water as the refrigerant of the heat pipe.

In addition, since the other end of the heat pipe where the radiation fins are provided extends obliquely with respect to the portion thereof which is inserted in the cooling block in the vertical direction, the radiation fins are made to extend substantially in the vertical direction. For this reason, the air warmed by the radiation fins is allowed to flow upwards through the radiation fins, resulting in that heat can be dissipated satisfactorily due to natural convection. Since heat radiation can be performed satisfactorily without equipping any fan, it is possible to improve the reliability of the cooling apparatus.

Further, since the other end portion of the heat pipe where the radiation fins are provided extends obliquely with respect to the vertical direction, a plurality of cooling units can be arranged in multiple stages in the vertical direction. Accordingly, it is possible to change the cooling capacity of the cooling unit in accordance with the calorific value of the electronic device unit without increasing the widthwise length of the cooling apparatus.

DESCRIPTION OF THE PREFERRED EMBODIMENTS

Figure 1:
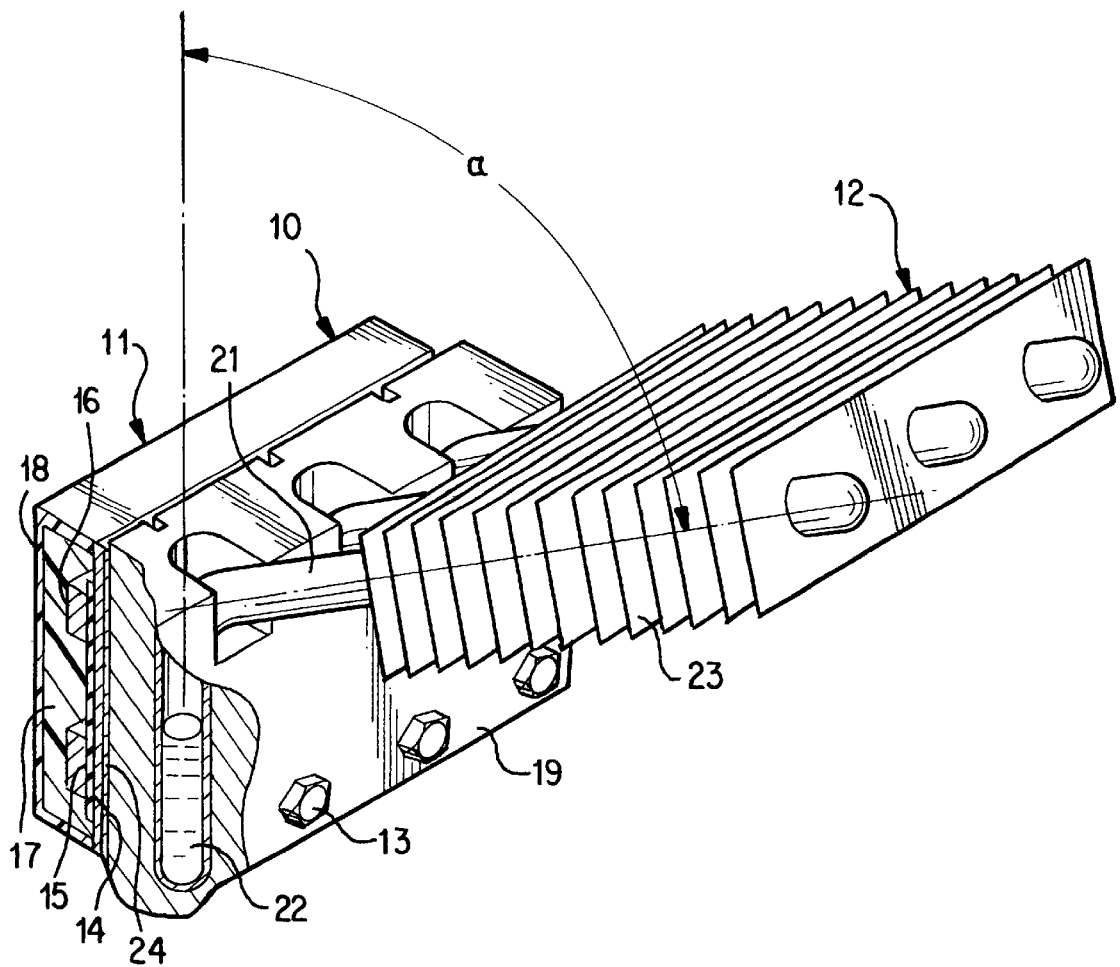
FIG. 1 is a partly broken-away perspective view of a first embodiment of a cooling apparatus for electronic device according to the present invention.

Description will be given of a first embodiment of a cooling apparatus according to the present invention with reference to FIG. 1. A cooling apparatus for electronic device 10 comprises an electronic element unit 11, a cooling unit 12 and bolts 13 by means of which these units are detachably kept in pressure contact with each other.

The electronic element unit 11 has a base member 14 made of copper. A thermal conductive electric insulating layer 15 is soldered to one of the surfaces of the base member 14, and a plurality of electronic elements 16 including thyrister and transistor, for example, are soldered to the thermal conductive electric insulating layer 15. Resin 17 is molded around the electronic elements 16, and the surface of the molded resin 17 is reinforced by plastic 18. As occasion demands, the resin 17 and the reinforcing plastic 18 may be dispensed with.

The cooling unit 12 has a cooling block 19 which is made of copper or ceramic and kept in contact with the other surface of the base member 14. The cooling block 19 is formed therein with a plurality of holes 20 extending in the vertical direction. In these holes 20 is press-fitted at least one heat pipe 21 in which a refrigerant, e.g., water 22 is sealingly contained. The heat pipe 21 extends, at a position where it is projected out of the cooling block 19, obliquely so as to make a predetermined angle α of not greater than 90° with respect to the vertical line, and a plurality of radiation fins 23 are provided in the end portion of the heat pipe 21 so as to extend in the direction perpendicular to the axis of the heat pipe 21. In other words, the plurality of radiation fins 23 extend substantially in the vertical direction.

The cooling block 19 is formed in position with through holes (not shown) which extend in the lateral direction, and the base member 14 is formed in position corresponding to these through holes with threaded holes (not shown). The bolts 13 are passed through the through holes and screwed in the threaded holes. By so doing, the base member 14 and the cooling block 19 are kept in pressure contact with each other.

Figure 2:
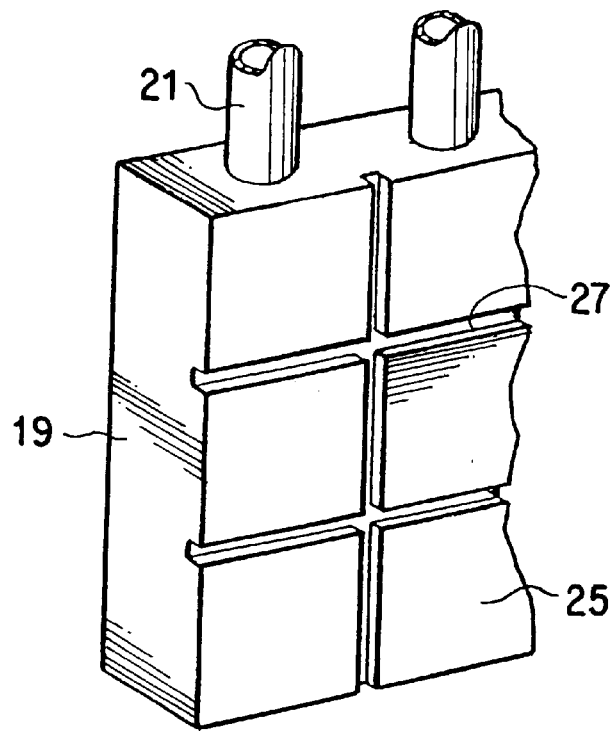
FIG. 2 is a perspective view of a cooling block of a cooling unit of the cooling apparatus according to the present invention.
Figure 3:
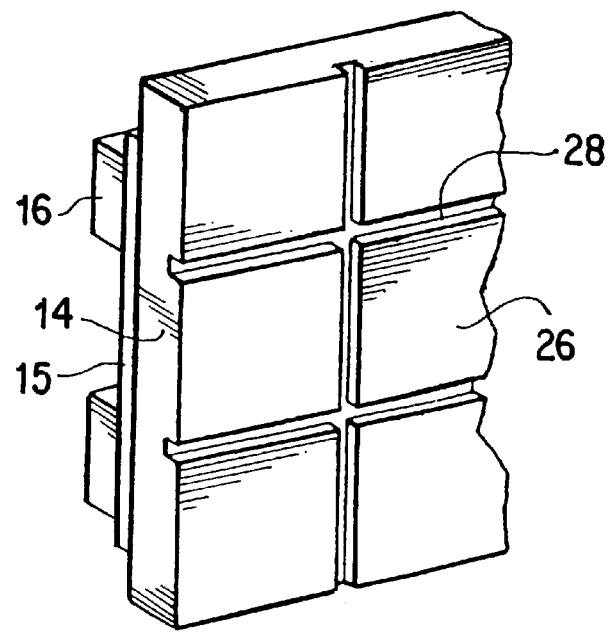
FIG. 3 is a perspective view of a base member of an electronic element unit of the cooling apparatus according to the present invention.

Between the contact surface of the base member 14 and the contact surface of the cooling block 19, thermal conductive grease 24 may be sandwiched as shown in FIG. 1. In this case, as shown in FIGS. 2 and 3, it is preferred that at least one of contact surfaces 26 and 25 of the base member 14 and the cooling block 19 is formed therein with grooves 17 or 28 which serve to receive the excessive thermal conductive grease 24. The reason is that, as the bolts 13 are screwed in, the contact surface of the base member 14 and the contact surface of the cooling block 19 are kept in pressure contact with each other and the excessive thermal conductive grease is received in the grooves 27, 28, and therefore, it is possible to form a thin film of thermal conductive grease, resulting in that the thermal conductivity can be improved.

Since the electronic elements 16 are soldered to the thermal conductive electric insulating layer 15, there is no possibility of generation of the contact thermal resistance between them. Accordingly, heat generated by the electronic element 16 is transferred efficiently to the thermal conductive electric insulating layer 15. Since the thermal conductive electric insulating layer 15 is soldered to the base member 14, there is no possibility of generation of the contact thermal resistance between them as well. Accordingly, heat transferred to the thermal conductive electric insulating layer 15 is transmitted effectively to the base member 14. Heat transmitted to the base member 14 is transferred to the cooling block 19 so as to heat the refrigerant (water) in the heat pipe 21, resulting in that the refrigerant is evaporated. The evaporated refrigerant moves upwards within the heat pipe 21 to the other ends thereof where the radiation fins 23 are provided. The air warmed by the radiation fins 23 due to heat exchange between the radiation fins 23 and the ambient air moves upwards through the radiation fins 23 without being hindered thereby since the radiation fins extend substantially in the vertical direction, thereby causing natural convection to occur. As a result, the radiation fins can be supplied with cold air at all times so that heat dissipation from the radiation fins to the ambient air can be performed effectively. In consequence, the refrigerant is liquefied and returned to the cooling block. In this way, heat of the electronic elements can be dissipated into the ambient air effectively.

In the embodiment described above, since the cooling apparatus 10 comprises the electronic element unit 11, the cooling unit 12 and the means 13 for detachably keeping these units in pressure contact with each other, when it becomes necessary to change the design of the electronic elements 16 in the electronic element unit 11, it is possible to detach the electronic element unit 11, change the electronic elements 16 and bring the electronic element unit 11 and the cooling unit 12 into pressure contact with each other again by the pressure contact means 13. Further, the positioning between the electronic element unit 11 and the cooling unit 12 can be per-formed automatically by the pressure contact means 13. Namely, the cooling apparatus according to the present invention has a good flexibility to change of the design of the electronic elements and is capable of changing the design at a low cost.

Moreover, in the electronic element unit 11, the electronic elements 16 are soldered to the thermal conductive electric insulating layer 15 and the thermal conductive electric insulating layer 15 is soldered to the base member 14, so that there is no possibility of generation of the contact thermal resistance between them. The portion where the contact thermal resistance is generated is only the pressure contact surface between the base member 14 of the electronic element unit 11 and the cooling block 19 of the cooling unit 12. Therefore, heat of the electronic element unit 11 can be transferred to the cooling unit 12 satisfactorily, so that cooling of the electronic element unit 11 can be performed sufficiently. Further, since the electronic elements 16 and the base member 14 are electrically isolated from each other in the electronic element unit 11, there is no possibility that the electric current flows through the cooling unit 12. Accordingly, the refrigerant 22 to be sealingly contained in the heat pipe 21 does not need to have an electric insulation. Therefore, it becomes possible to use water as the refrigerant of the heat pipe 21.

In addition, since the other end of the heat pipe 21 where the radiation fins 23 are provided extends obliquely with respect to the portion thereof which is inserted in the cooling block 19 in the vertical direction, the radiation fins 23 are made to extend substantially in the vertical direction. For this reason, the air warmed by the radiation fins 23 is allowed to flow upwards through the radiation fins 23, resulting in that heat can be dissipated satisfactorily due to natural convection. Since heat radiation can be performed satisfactorily without equipping any fan, it is possible to improve the reliability of the cooling apparatus.

Figure 4:
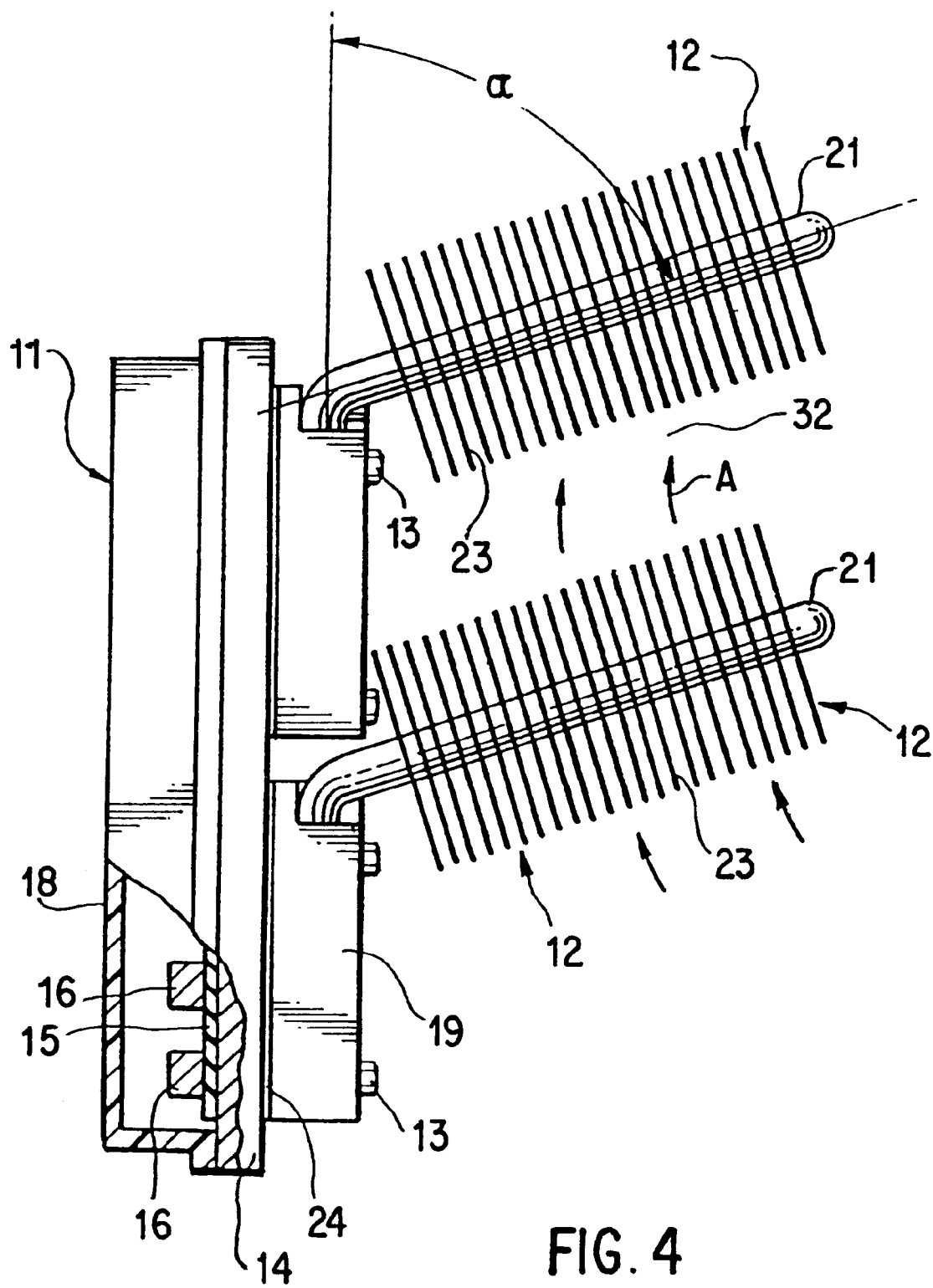
FIG. 4 is a partly broken-away side view of a second embodiment of the cooling apparatus according to the present invention.

FIG. 4 illustrates a second embodiment of the cooling apparatus according to the present invention. In the second embodiment, a plurality of cooling units 12 are mounted on the base member 14 of a single electronic element unit 11 so as to be arranged in multiple stages in the vertical direction, and the structures of the electronic element unit 11 and the cooling unit 12 are the same as those of the first embodiment.

In the second embodiment, since the air warmed by the radiation fins 23 is allowed to flow upwards through the radiation fins 23, heat can be dissipated satisfactorily due to natural convection. Particularly, the air warmed by the radiation fins 23 of the lower cooling unit moves upwards to mix with the low-temperature air in a space defined between the upper and lower cooling units, so that the radia-tion fins of the upper cooling unit can be cooled effectively. Since it is possible to radiate heat satisfactorily without equipping any fan, the reliability of the cooling apparatus can be improved.

Further, since the other end portion of the heat pipe where the radiation fins are provided extends obliquely with respect to the vertical direction, a plurality of cooling units can be arranged in multiple stages in the vertical direction. Accordingly, it is possible to change the cooling capacity of the cooling unit in accordance with the calorific value of the electronic element unit without increasing the widthwise length of the cooling apparatus.

Figure 5:
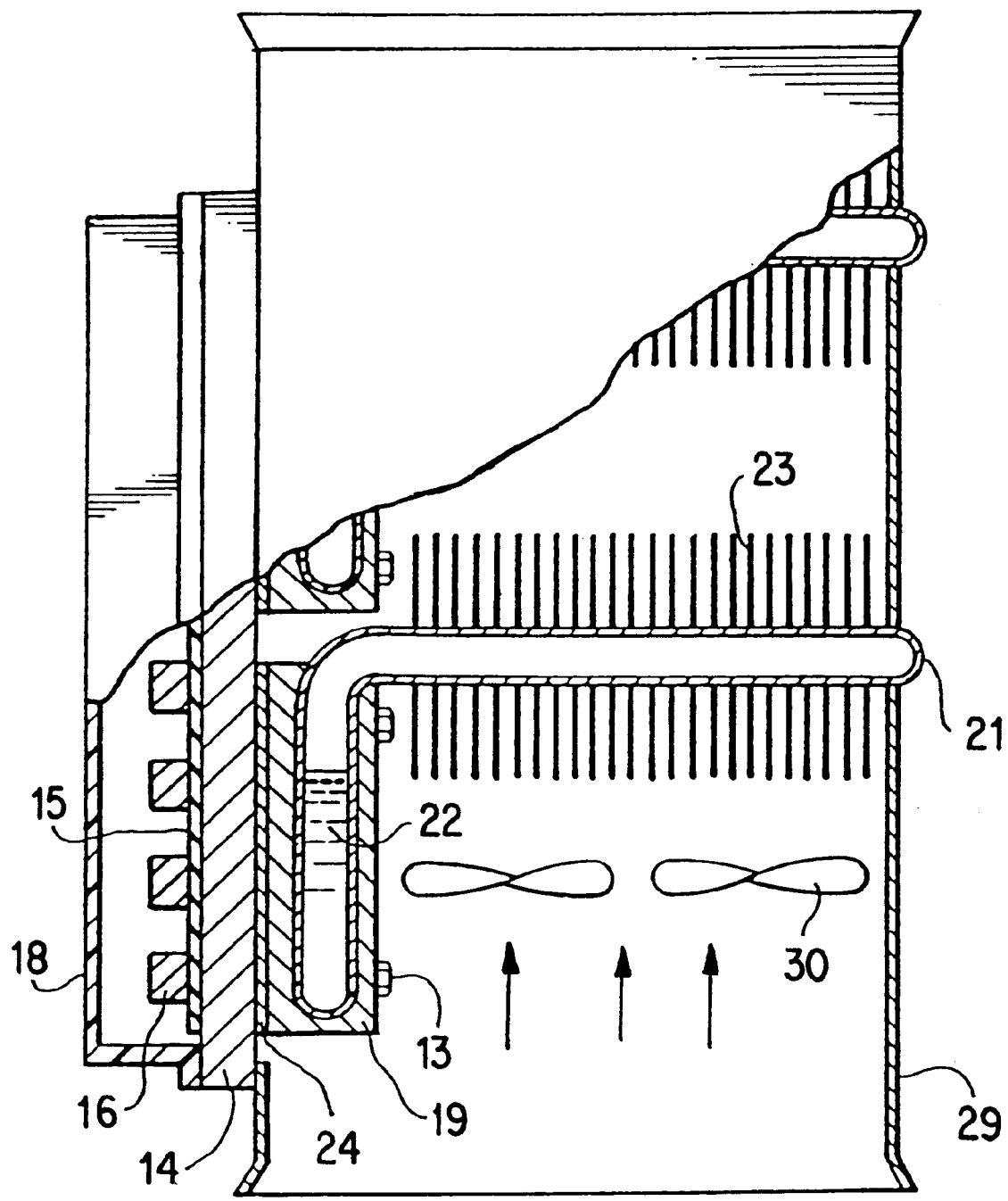
FIG. 5 is a partly broken-away side view of a third embodiment of the cooling apparatus according to the present invention.

In a third embodiment shown in FIG. 5, the heat pipe 21 of the second embodiment is bent to an angle of about 90°, a fan duct 29 extends in parallel with the radiation fins so as to envelop the radiation fins therein, and fans 30 are disposed in the fan duct 29 so as to produce air currents directed toward the radiation fins. This construction is suitable when heat radiation due to natural convection is not sufficient.

Figure 6:
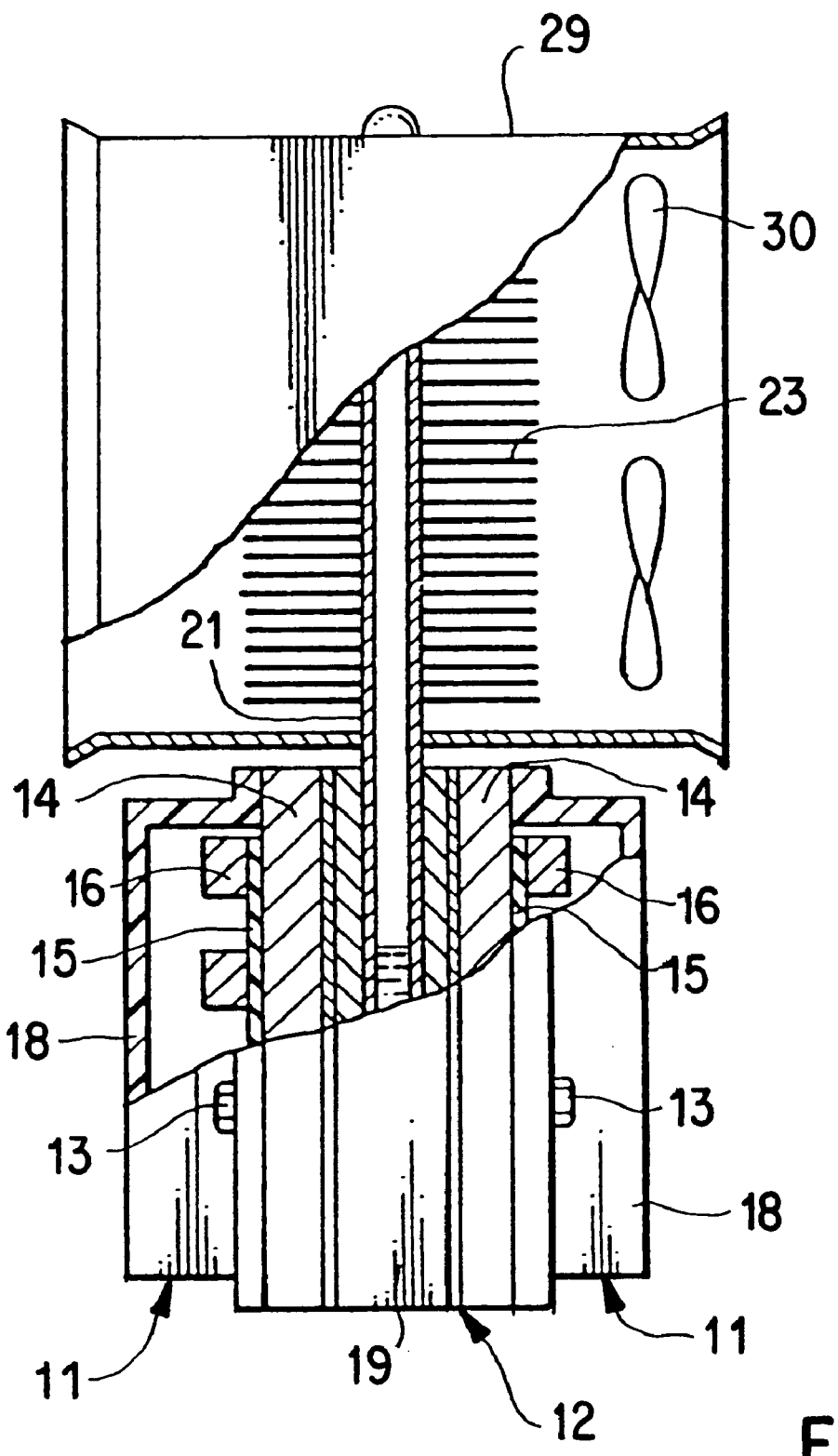
FIG. 6 is a partly broken-away side view of a fourth embodiment of the cooling apparatus according to the present invention.

A fourth embodiment shown in FIG. 6 comprises a single cooling unit 12 and two electronic element units 11 contrary to the second embodiment. The heat pipe 21 of the cooling unit 12 extends vertically and the electronic element units 11 are kept in pressure contact with the both surfaces of the cooling block 19 by means of the bolts 13.

Figure 7:
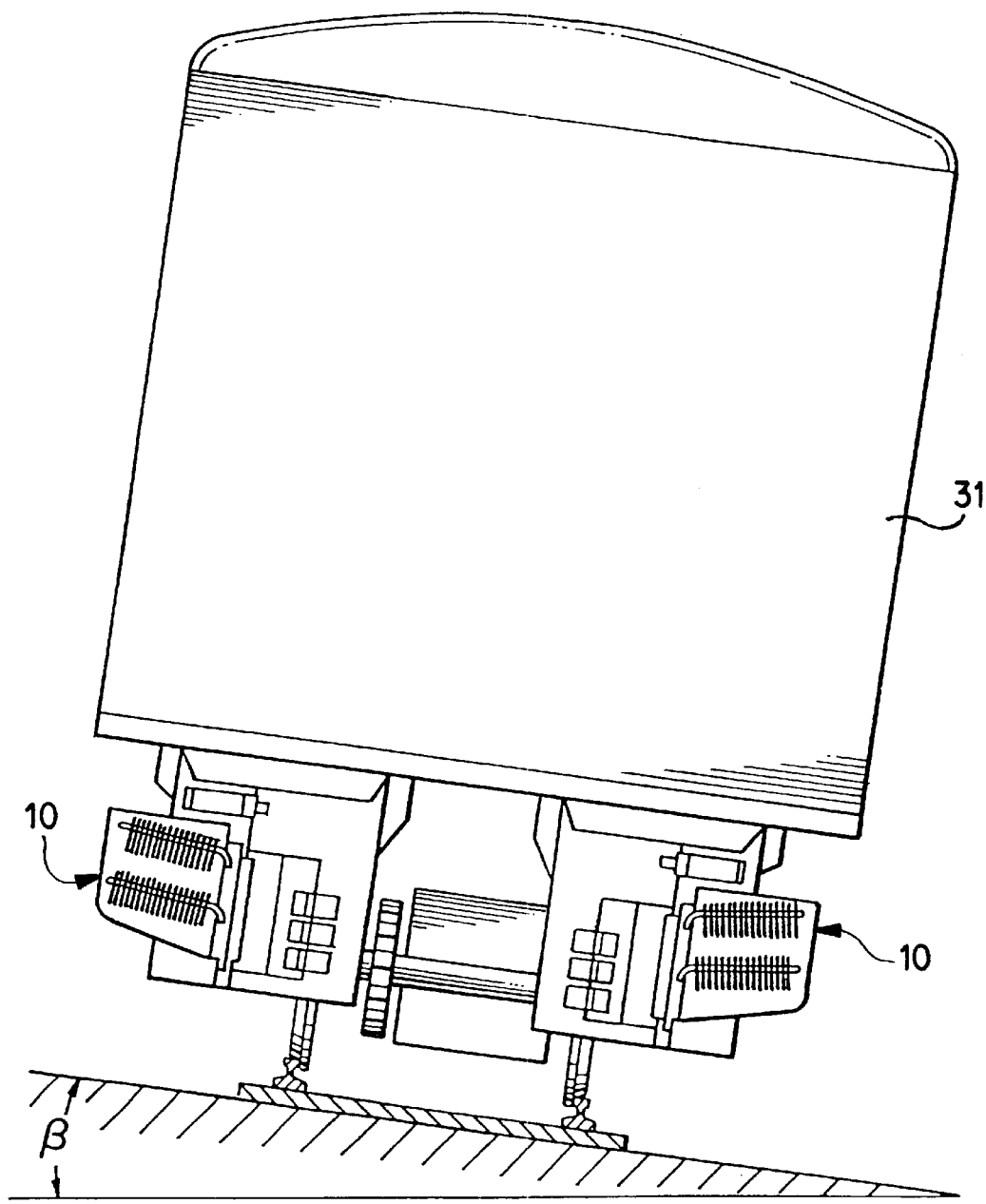
FIG. 7 is a partly sectioned schematic front view of a vehicle on which the second embodiment of the cooling apparatus of the present invention is mounted.

FIG. 7 illustrates the second embodiment of the cooling apparatus according to the present invention in a state that it is mounted on a railway vehicle. The refrigerant liquefied due to heat radiation must be returned into the cooling block. On the other hand, a bank β of the railway track is not greater than 7°. For this reason, a bending angle α of the heat pipe is set to be not greater than 83° so that the liquefied refrigerant can be returned into the cooling block constantly.

What is claimed is:

1. A cooling apparatus for electronic elements wherein an electronic element unit and a cooling unit are thermally interconnected and arranged side-by-side, said electronic element unit comprising a base member, a thermal conductive electric insulating layer and a plurality of electronic elements; said base member has a vertical surface for mounting thereon electronic elements; said plurality of electronic elements are mounted side-by-side on said vertical electronic elements mounting surface of said base member through said thermal conductive electric insulating layer; said cooling unit comprising a cooling block thermally connected to said base member, at least one heat pipe and a plurality of radiation fins; said at least one heat pipe having water sealingly contained therein as refrigerant, one end portion of said at least one heat pipe being mounted in said cooling block in thermal contact therewith and extending in a vertical plane direction and another end portion of said at least one heat pipe protruding and extending from said cooling block in an oblique and upward direction to terminate at a free end; and said plurality of radiation fins being attached on said another end portion of said at least one heat pipe so as to extend substantially perpendicular to said another end portion.

2. A cooling apparatus according to claim 1, wherein said predetermined angle is not greater than 83°.

3. A cooling apparatus according to claim 1, wherein said cooling block is made of ceramic.

4. A cooling apparatus according to claim 1, wherein said cooling block is made of metal.

5. A cooling apparatus according to claim 1, wherein said refrigerant is water.

6. A cooling apparatus according to claim 1, wherein said at least one cooling unit includes a plurality of cooling units which are arranged in the vertical direction.

7. A cooling apparatus according to claim 1, wherein thermal conductive grease is sandwiched between said base member of said electronic element unit and said cooling unit.

8. A cooling apparatus according to claim 7, wherein at least one of pressure contact surfaces of said base member and said cooling unit is formed therein with a plurality of grooves.

9. A cooling apparatus according to claim 1, wherein said cooling unit further comprises a fan duct which extends in parallel with said radiation fins so as to envelop the same therein, and a fan which is disposed in said fan duct so as to produce air currents directed toward said radiation fins.

10. A cooling apparatus for electronic elements wherein an electronic element unit and a cooling unit are thermally interconnected, said electronic element unit comprising a plurality of electronic elements arranged side-by-side; said cooling unit comprising a cooling block thermally connected to said plurality of electronic elements, at least one heat pipe and a plurality of radiation fins; said at least one heat pipe having refrigerant sealingly contained therein, wherein one side, in a lengthwise direction, of said at least one heat pipe is vertically mounted in said cooling block in thermal contact therewith and another side, in the lengthwise direction, of said at least one heat pipe protrudes and extends from said cooling block in an oblique, upward direction and terminates in a free end; and said plurality of radiation fins being attached on said another side of said at least one heat pipe and extended substantially parallel with respect to a connecting surface of said electronic element unit and said cooling unit.

11. A cooling apparatus for electronic elements wherein an electronic element unit and a cooling unit are thermally interconnected and mounted side-by-side; said electronic element unit comprising a base member, a thermal conductive electric insulating layer and a plurality of electronic elements, said base member having a surface for mounting thereon electronic elements; said plurality of electronic elements being mounted side-by-side on said electronic elements mounting surface of said base member through said thermal conductive electric insulating layer; said cooling unit comprising a cooling block thermally connected to said base member, at least one heat pipe and a plurality of radiation fins; said at least one heat pipe has refrigerant sealingly contained therein, wherein one side, in a lengthwise direction, of said at least one heat pipe is inserted into a hole of said cooling block in thermal contact therewith and is mounted and extends along a vertical direction of said electronic elements mounting surface of said base member and another side, in the lengthwise direction, of said at least one heat pipe protrudes and extends from said cooling block in a direction oblique with respect to said electronic element mounting surface of said base member and terminates at a free end; and said plurality of radiation fins being attached on said another side of said at least one heat pipe and extended substantially parallel with respect to a connecting surface of said electronic element unit and said cooling unit.

* * * * *